United States Patent [19]

Meyer et al.

[11] 3,806,822

[45] Apr. 23, 1974

[54] PHASE LOCKED LOOP EMPLOYING GATED ALTERNATING CURRENT INJECTION FOR FAST SYNCHRONIZATION

[75] Inventors: Gerald L. Meyer, Tempe; Carl R. Ryan, Mesa, both of Ariz.

[73] Assignee: Motorola, Inc., Franklin Park, Ill.

[22] Filed: Dec. 13, 1972

[21] Appl. No.: 314,658

[52] U.S. Cl. .................... 328/55, 307/262, 307/269, 328/62, 328/63, 328/155, 331/10

[51] Int. Cl. .......................... H03k 1/12, H03k 5/13

[58] Field of Search ........... 328/55, 56, 62, 72, 155, 328/223; 307/262, 269; 331/10

[56] References Cited

UNITED STATES PATENTS

| | | | |
|---|---|---|---|
| 2,740,046 | 3/1956 | Tellier | 328/155 X |
| 3,074,027 | 1/1963 | Rout | 331/10 X |
| 3,460,052 | 8/1969 | Rader et al. | 331/10 |
| 3,701,953 | 10/1972 | Lubarsky, Jr. | 328/155 |

*Primary Examiner*—John Zazworsky
*Attorney, Agent, or Firm*—Vincent J. Rauner; Victor Myer

[57] ABSTRACT

A phase locked loop circuit usable for clock synchronization in a digital signalling system for locking an oscillator to a reference signal includes a gated amplifier for applying the reference signal to a frequency determining element of the oscillator prior to synchronization to cause the oscillator to oscillate at the reference frequency, thereby reducing the time required to achieve synchronization of the oscillator. After synchronization has been achieved, a synchronization detector circuit applies a disabling signal to the gated amplifier for discontinuing the application of the reference signal to the oscillator, and synchronization is maintained by means of a direct current control voltage applied to the oscillator from a phase detector within the phase locked loop.

12 Claims, 2 Drawing Figures

PHASE LOCKED LOOP EMPLOYING GATED ALTERNATING CURRENT INJECTION FOR FAST SYNCHRONIZATION

BACKGROUND

1. Field of Invention

This invention relates generally to phase locked loop synchronizing systems, and more particularly to fast acquisition systems used in data transfer or communications systems.

There are many applications wherein it is necessary to provide an alternating signal in synchronism with another signal. One such application for such a system is in a digital data communications system wherein a clock in a receiver must be synchronized to a clock in a transmitter which is transmitting thereto in order to properly decode the data being transmitted by the transmitter. In such a system, it is desirable that the synchronization of the receiver clock with the transmitter clock be achieved rapidly in order that no data is lost during the time interval prior to synchronization. In addition, the output frequency of the receiver clock must be relatively free from "jitter" and noise, which result from an imperfect transmission path between the transmitter and receiver, in order to provide decoding of the digital data with a minimum number of errors.

2. Prior Art

Several techniques for synchronizing an oscillator with another are known. These systems generally utilize a phase locked loop comprising a phase detector which compares the phase of the oscillator signal with the phase of the signal to which the oscillator is to be locked and provides a control signal to the oscillator to bring it in step with the synchronizing signal. A loop filter is generally interposed between the phase detector and oscillator to filter the control signal applied to the oscillator to remove the noise, which results from noise or other imperfections in the transmission path, from the control signal, thereby minimizing the noise or jitter on the signal provided by the oscillator. The amount of noise or jitter that is removed from the oscillator signal is dependent upon the amount of filtering of the control signal. However, when a large amount of control signal filtering is employed, the amount of time required for the oscillator to lock to the reference signal greatly increases, and in some instances, synchronism may never be achieved.

Techniques exist for minimizing the amount of time required to lock an oscillator to another signal when a large amount of control signal or loop filtering is employed. Variable bandwidth loop filters are employed having a wide bandwidth prior to lock achieve rapid lock or acquisition time, and a narrow bandwidth following lock to reduce the amount of noise produced by the oscillator. In addition, means may be provided to sweep the oscillator through the expected range of locking signals to reduce the amount of time required for acquisition.

Whereas these techniques provide a way to produce a signal in synchronism with another signal, in the relatively simple systems, the bandwidth of the loop filter must be chosen to provide a compromise between acquisition time and the amount of noise produced by the oscillator, thereby limiting the performance of the system. Where higher performance is required, the variable bandwidth and sweep techniques are necessary, however their incorporation greatly increases the cost and complexity of the system. The reference signal injection system is usable to provide rapid acquisition of a signal that contains a large signal component at the oscillator frequency, but is not useful in a data transmission system wherein the energy of the data signal is spread over a wide frequency band and has only a small component at the oscillator frequency. In addition, the other frequencies generated by a data system, when applied to the oscillator, tend to increase the noise and jitter of the signal produced thereby.

SUMMARY

It is an object of the present invention to provide a phase locked loop system providing rapid acquisition and a relatively spectrally pure output signal.

It is a further object of this invention to provide a high performance phase locked loop system utilizing a minimum number of components.

It is another object of this invention to provide a means for synchronizing a clock in a digital data transfer system with maximum reliability and minimum time.

In accordance with a preferred embodiment of the invention, a phase locked loop having an oscillator, phase detector and loop filter is employed. According to the invention, a gate means, such as, for example, a gated amplifier, is interposed between a source of reference signals and a frequency selective element in the oscillator. Prior to acquisition, the gated amplifier applies the reference signal to the oscillator to cause the oscillator to operate at the same phase as the reference signal, thereby reducing the loop acquisition time. After the oscillator has been brought into synchronism with the reference signal, a signal from the phase detector disables the gated amplifier to discontinue the application of the reference signal to the oscillator, and the system operates as a normal phase locked loop.

When the phase locked loop, according to the invention, is employed in a system for transmitting data which has very little energy at the oscillator frequency, a signal having a relatively large component at the oscillator frequency is transmitted prior to the transmission of the data. The synchronizing signal is coupled to the oscillator through the gated amplifier and causes the phase locked loop to lock. After lock has been achieved, the disabling of the amplifier prevents the data from increasing the amount of noise produced by the oscillator, and the oscillator is maintained in lock by the phase locked loop which now requires only the small oscillator frequency component contained in the data to maintain the system in synchronism.

DETAILED DESCRIPTION

Figure 1:
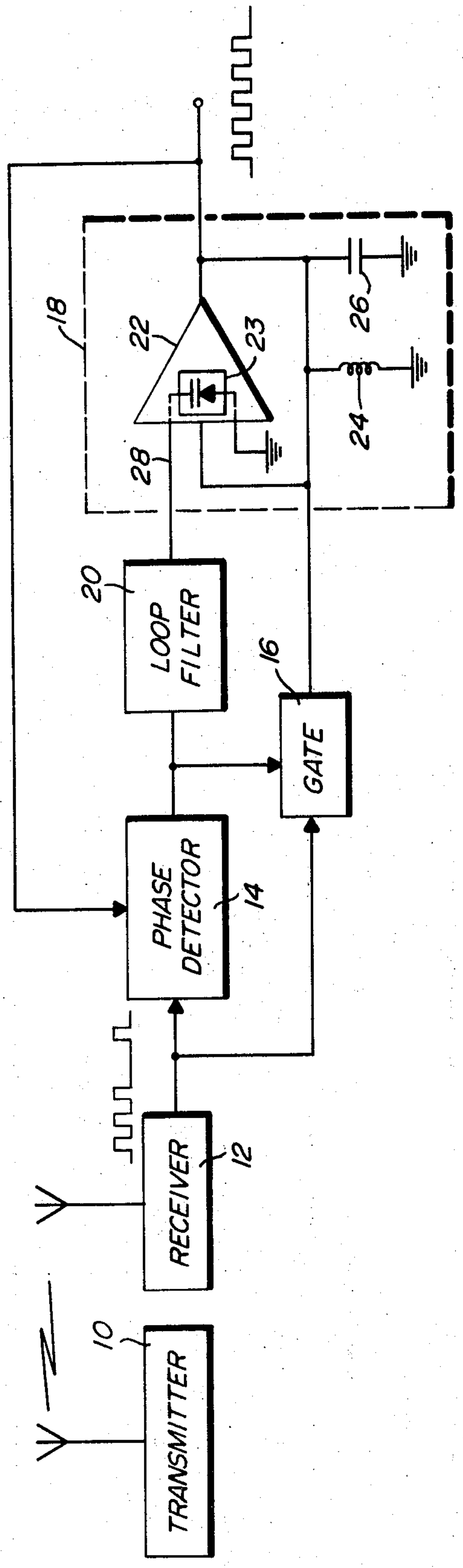
FIG. 1 is a simplified block diagram of the phase locked loop according to the invention shown in the environment of a digital signal transmission system.

Referring to FIG. 1, there is shown a simplified block diagram of a digital transmission system using the phase locked loop of the instant invention as a clock recovery circuit. A transmitter 10 transmits a signal containing digital information to a receiver 12. The receiver 12 is connected to a comparator means, in this embodiment a phase detector 14, and to a gate means, in this embodiment a gate 16, and provides digital signals thereto. The phase detector 14 is also connected to an output of an oscillator means comprising an oscillator 18, and compares the phase of the output signal from the oscillator 18 with the phase of the digital signal from the receiver 12. A loop filter 20, which is a low pass filter in this embodiment, is connected to the phase detector 14 and the oscillator 18. The gate 16 is also connected to the phase detector 14 and to the oscillator 18.

The oscillator 18 in this embodiment comprises an amplifier 22 having a positive feedback loop including a frequency determining circuit including an inductor 24 and a capacitor 26 connected thereto for causing oscillation. In this embodiment, the gate 16 is connected to the inductor 24 and capacitor 26 of the frequency determining network, and the loop filter is connected to a frequency control terminal 28 of the amplifier 22. The frequency control terminal 28 is connected to a voltage variable impedance element 23, such as, for example, a voltage variable capacitor or an active transistor stage.

A voltage controlled oscillator of well known form which may be utilized for the oscillator 18 is disclosed in Application Note AN-210 FM Modulation Capabilities of Epicap VVC's prepared by the Microwave Devices Group of Motorola Semiconductor Products, Inc. and published in the Semiconductor Data Book 3rd Ed., January 1968, pp. 16–95 to 16–101 by the Semiconductor Products Division of Motorola Inc.

In operation, a digital signal from the receiver 12 is applied to the phase detector 14 and the gate 16. The gate 16 is normally in a conductive mode and passes the digital signal therethrough and applies the digital signal to the combination of the inductor 24 and capacitor 26. This forces the aforesaid combination to oscillate or "ring" at a frequency substantially equal to and in phase with a frequency component of the digital signal that has substantially the same frequency as the resonant frequency of the aforesaid tuned circuit. The ringing of the tuned circuit causes the oscillator 18 to oscillate approximately in phase with the frequency component of the signal from the receiver 12 to which the oscillator 18 is to be locked, thereby reducing the time required to achieve lock. The output signal from the oscillator 18 is compared to the signal from the receiver 12 and a control voltage is applied to the oscillator 18 through the loop filter 20 to adjust the frequency of the oscillator 18 to bring the output signal thereof into synchronism with the signal from the receiver 12. When the oscillator 18 is in synchronism with the input signal from the receiver 12, the phase detector 14 provides a signal to the gate 16 to open the path between the receiver 12 and oscillator 18 to discontinue the application of the signal from receiver 12 to the oscillator 18. The oscillator 18 is then maintained in synchronism with the signal from receiver 12 by the control signal applied thereto from the phase detector 14.

In data transmission systems of the type wherein the clock frequency is not continuously transmitted, the data signal from the receiver 12 generally has a relatively broad bandwidth, and the energy contained in the data signal is usually spread over a continuous frequency distribution within that bandwidth. As a result of the spreading of the energy over the frequency band there is very little energy at any one particular frequency including the clock frequency. Therefore, in order to speed up the synchronization of the oscillator 18, a synchronizing signal containing a relatively high spectral component at the clock frequency is transmitted for a short period of time sufficient to cause lock prior to the transmission of the data. The synchronizing preamble can be any sequence of ones and zeroes chosen to enhance the clock frequency spectral component, such as, for example, alternating ones and zeroes. The synchronizing signal is passed by the gate 16 to the oscillator 18 to cause the oscillator to oscillate at the proper frequency. Because of the enhanced clock frequency spectral component present in the synchronizing signal, the oscillator 18 achieves the desired frequency in a significantly shorter period of time than would be the case if only data, which has limited energy at the clock frequency were applied to the oscillator 18. After lock occurs, the energy at the clock frequency in the data portion of the signal is sufficient for the phase detector 14 to provide a control signal to maintain the oscillator 18 synchronized after the gate 16 has been disabled. As a result, the oscillator 18 provides a steady train of constant frequency pulses independent of the particular pattern of the data pulses from the receiver 12, and a constant frequency synchronizing signal is not necessary to maintain the system in synchronization.

Figure 2:
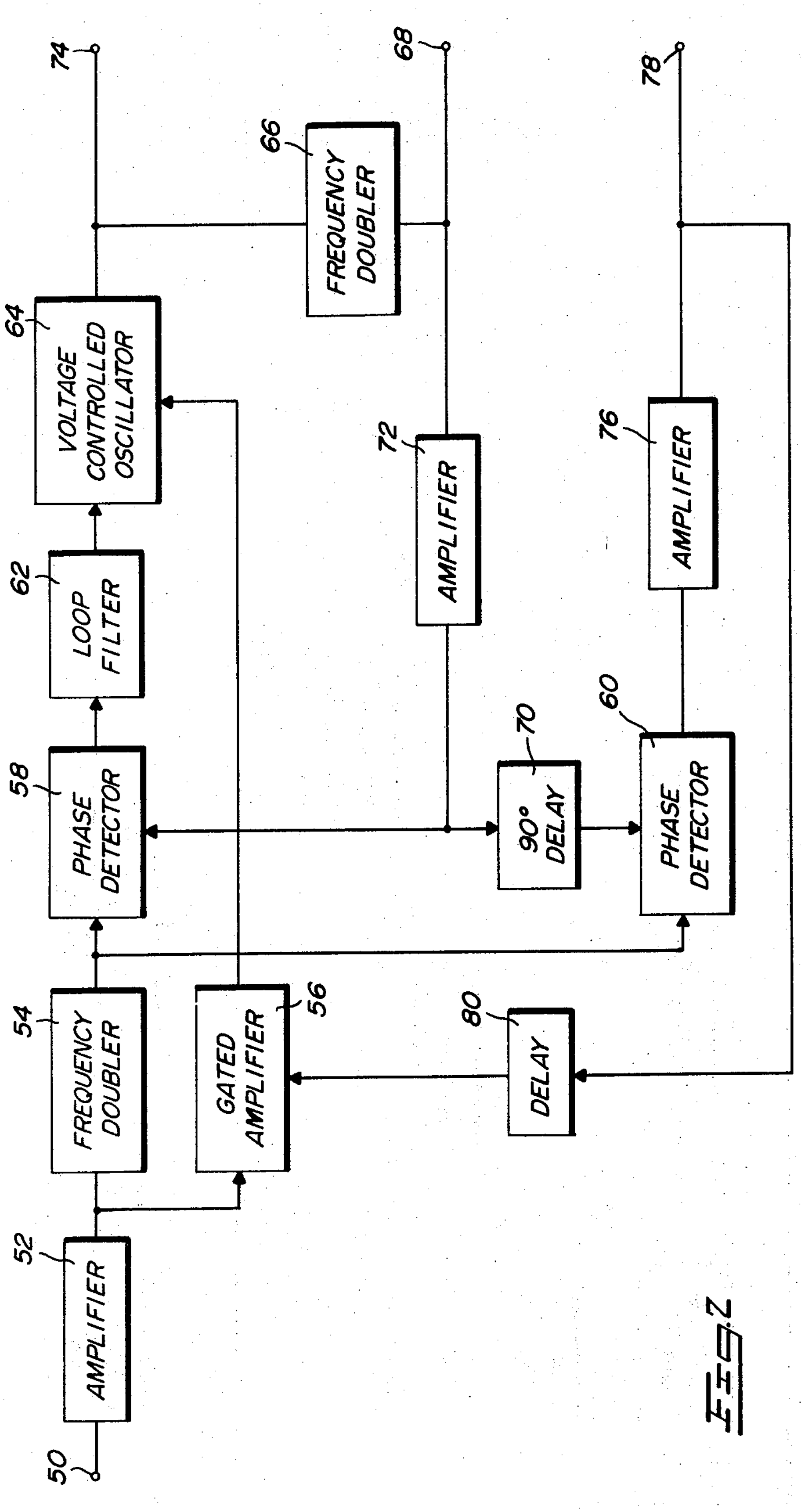
FIG. 2 is a block diagram of a preferred embodiment of the phase locked loop according to the invention for providing two synchronized signals having different frequencies and a signal for indicating synchronism of the system.

Referring to FIG. 2, there is shown a preferred embodiment of the phase locked loop according to the invention. An amplifier 52 is connected to an input point 50, which may be connected to any source of alternating signals, such as, for example, the receiver 12 of FIG. 1. The output of the amplifier 52 is connected to the input of a frequency multiplier means, in this embodiment, a frequency doubler 54, and to the input of a gated amplifier 56, which serves as the gate means in the circuit of this embodiment. The output of the frequency doubler 54 is connected to a first phase detector 58 and a second phase detector 60 which operates as a coherence detector. The phase detectors 58 and 60 serve as a comparator means for the circuit of FIG. 2. The phase detector 58 is connected to provide a control signal to a voltage controlled oscillator 65 through a loop filter 62. The voltage controlled oscillator 64 is also connected to the gated amplifier 56 and to a second frequency doubler 66, which has an output terminal connected to an output point 68, the phase detector 58 and a 90° delay circuit 70 through an amplifier 72. The oscillator 64 and the frequency doubler 66 cooperate to form an oscillator means in this embodiment. Another output point 74 is connected to the junction of the voltage controlled oscillator 64 and the frequency doubler 66. The output of the phase detector 60 is connected to the input of an amplifier 76, which has an output connected to an output point 78 and to the gated amplifier 56 through a delay circuit 80.

The operation of the circuit of FIG. 2 is similar to the operation of the circuit of FIG. 1. Additional circuitry has been added in FIG. 2 to provide two simultaneous output frequencies and a signal indicative of synchronism of the loop. A signal, such as, for example, a digital signal having a predetermined bit rate is applied to the input point 50 connected to the amplifier 52. The output of the amplifier 52, which is an amplified representation of the signal applied thereto is applied to the frequency doubler 54, which doubles the frequency of the signal applied thereto and applies the frequency doubled signal to the phase detectors 58 and 60. The frequency doubler 54 is used in this embodiment because it is desired that the clock signal appearing at the output point 68 make a complete cycle during each bit period of the signal applied to the input point 50. In order to achieve a complete cycle of the clock signal at the output point 68 during a bit period of the data signal applied to the input point 50, it is necessary that the clock frequency of the signal at the output point 68 be equal to twice the frequency of the data signal at point 50. Hence, the frequency of the data signal from the amplifier 52 must be doubled prior to application to the phase detector 58 to provide the proper frequency reference signal thereto for comparison with the clock signal from the output point 68, which is applied to the phase detector 58 through the amplifier 72.

As in the circuit of FIG. 1, the alternating current input signal is applied to the oscillator 64 to cause the aforementioned oscillator to oscillate at a frequency substantially equal to the synchronous frequency. The oscillator 64 of FIG. 2 is similar to the oscillator 18 of FIG. 1, and the alternating current signal is applied to a frequency determining element thereof as in the case of the oscillator 18 of FIG. 1. In the circuit of FIG. 2, however, the alternating current signal is amplified by the amplifier 52 and the gated amplifier 56 to further increase the speed at which the oscillator 64 begins to oscillate at the desired frequency. It is not necessary to double the frequency of the alternating current input signal before applying the signal to the oscillator 64 because, in this embodiment, the oscillator 64 is followed by a frequency doubler 66, and hence, is oscillating at one-half the clock frequency. The output of the oscillator 64 is connected to the output point 74 to provide an output frequency equal to one-half of the clock frequency.

The phase detector 60 receives signals from the frequency doubler 54 and the frequency doubler 66 through the amplifier 72 and the delay circuit 70. The phase detector 60 is designed to provide an output signal to the amplifier 76 when the signals applied to the phase detector 60 are substantially in phase. When this occurs, the amplifier 76 provides an output signal to the output point 78 to indicate that the circuit is in synchronism, and to the gated amplifier 56 through the delay 80 to discontinue the application of the signal from amplifier 52 to the oscillator 64. As in the circuit of FIG. 1, the oscillator 64 is maintained in synchronism with the input signal by the control signal from the phase detector 58 and provides a substantially constant frequency output signal regardless of the particular data pattern being received. In addition, as in the case of the circuit of FIG. 1, a synchronizing signal having an enhanced spectral component at the oscillator frequency may be transmitted prior to the transmission of the data to further reduce the synchronization time. Also, the circuit may be used with any source of alternating signals in addition to data signals, such as radio frequency and audio signals and still fall within the scope of the instant invention.

I claim:

1. A circuit for providing a signal having a predetermined phase relationship to a reference signal applied thereto from a reference signal source, including in combination:

an oscillator means for providing an alternating current signal;

comparator means connected to said reference signal source and said oscillator means and responsive thereto for providing a control signal indicative of the phase relationship of said alternating current signal and said reference signal;

means connecting said comparator means and said oscillator means for applying said control signal to said oscillator means for adjusting the frequency of said alternating current signal; and gate means connected to said reference signal source and said oscillator means for applying an alternating signal representative of said reference signal to said oscillator means, said gate means being further connected to said comparator means and responsive thereto for discontinuing the application of said alternating signal to said oscillator means when said alternating current signal and said reference signal have said predetermined phase relationship therebetween.

2. A circuit as recited in claim 1 wherein said oscillator means has a frequency determining circuit therein, and wherein said gate means is connected to said frequency determining circuit.

3. A circuit as recited in claim 2 wherein said gate means includes a gated amplifier.

4. A circuit as recited in claim 3 wherein said oscillator means includes a variable impedance element and said connecting means is connected to said variable impedance element.

5. A circuit as recited in claim 4 wherein said connecting means includes a low pass filter.

6. A circuit as recited in claim 5 wherein said comparator means includes a phase detector for providing said control signal.

7. A circuit as recited in claim 6 wherein said comparator means further includes a second phase detector connected to said gate means for controlling the application of said alternating current signal to said oscillator means.

8. A circuit as recited in claim 1 further including frequency multiplier means interposed between said reference signal source and said comparator means for multiplying the frequency of the reference signal applied to said comparator means.

9. A circuit as recited in claim 8 wherein said frequency multiplier means includes a frequency doubler.

10. In an information tranfer system having means for transmitting and receiving digital data, the method of synchronizing clock means in said receiving means to the frequency of a clock in said transmitting means, comprising the steps of:

transmitting a digital signal including data and a synchronizing signal having a substantial signal component with a predetermined frequency relationship to said clock frequency from said transmitting means, said synchronizing signal being transmitted prior to the transmission of the data;

receiving said digital signal and applying said signal component to said clock means in said receiving means to cause said clock means to oscillate at substantially the frequency of said signal component;

comparing the oscillations of said clock means with said received digital signal and providing, in response thereto, a control signal to said clock means for synchronizing said oscillations with said received digital signal; and discontinuing the application of said signal component to said clock means when said clock means has been brought into synchronism with said received digital signal.

11. The method recited in claim 10 wherein transmitting said synchronizing signal includes the step of transmitting an alternating sequence of ones and zeroes.

12. In a system for transferring digital data, a clock synchronizing system comprising:

means for transmitting a digital signal including digital data and a synchronizing signal;

means for receiving the digital signal from said transmitting means;

clock means for providing an alternating current signal;

comparator means connected to said receiving means and said clock means and responsive thereto for providing a control signal indicative of the phase relationship of said alternating current signal and the digital signal;

means connecting said comparator means and said clock means for applying said control signal to said clock means for adjusting the frequency of said alternating current signal; and gate means connected to said receiving means and said clock means for applying an alternating current signal representative of said synchronizing signal to said clock means, said gate means being further connected to said comparator means and responsive thereto for discontinuing the application of said synchronizing signal to said clock means when said alternating current signal is substantially synchronized to said digital signal.

* * * * *